United States Patent [19]
Murphy

[11] Patent Number: 5,985,161
[45] Date of Patent: Nov. 16, 1999

[54] METHOD OF FORMING PRINTED CIRCUITS HAVING MULTIPLE CONDUCTOR THICKNESSES

[75] Inventor: Davis W. Murphy, Hudson, N.H.

[73] Assignee: Advanced Circuit Technology, Inc., Nashua, N.H.

[21] Appl. No.: 08/968,766

[22] Filed: Sep. 10, 1997

[51] Int. Cl.$^6$ ...................................................... B44C 1/22
[52] U.S. Cl. ................................. 216/20; 216/14; 216/33
[58] Field of Search ................................. 216/13, 14, 16, 216/20, 33, 100, 105; 428/209, 901

[56] References Cited

U.S. PATENT DOCUMENTS 5,274,195  12/1993  Murphy et al. .
5,378,306   1/1995  Cibulsky et al. ........................... 216/20
5,505,321   4/1996  Caron et al. ............................... 216/20

*Primary Examiner*—William Powell
*Attorney, Agent, or Firm*—Davis and Bujold

[57] ABSTRACT

A method of forming a conductive network, having relatively flexible electrical conductor areas integral with relatively rigid electrically conductor areas including (a) providing a relatively rigid laminate having a dielectric lamina supporting, at least in part, a first electrically conductive lamina which is in electrically conductive intimate contact with a second electrically conductive lamina by way of an electrically conductive barrier layer, the first and second conductive laminae being of a material etchable by an etchant which is not an etchant for the barrier layer; (b) selectively etching desired portions of the aid second electrically conductive lamina to the barrier layer in at least the relatively flexible areas using the etchant; and (c) selectively etching desired exposed metallic portions of the laminate down to the dielectric lamina to form the conductive network using an etchant, the etchant chosen to etch both the conductive lamina and the barrier layer.

5 Claims, 1 Drawing Sheet

METHOD OF FORMING PRINTED CIRCUITS HAVING MULTIPLE CONDUCTOR THICKNESSES

FIELD OF THE INVENTION

This invention relates to methods of forming and manufacturing printed circuit conductive networks with conductors formed to different thicknesses and more particularly, though not exclusively, to flexible multiple conductor electric connecting networks composed of single sided adhesiveless materials capable of being etched utilizing a same side etching technique to produce conductors having two thicknesses.

BACKGROUND OF THE INVENTION

It is sometimes necessary to fabricate multiple conductor interconnect cables that have requirements to minimize voltage drops along the length of the conductors, yet have specific regions of the cable where flexibility is paramount. These two requirements can cause conflicts in the design of the cable.

Minimizing the voltage drop along the length of a specific conductor means fabricating the conductor with a greater cross-sectional area to reduce electrical resistance. This can be accomplished by increasing either the conductor width, thickness or both. Increasing the flexibility of a specific conductor means fabricating the conductor with a smaller cross-sectional area. This can be accomplished by decreasing either the conductor width, thickness or both.

If the conductor widths of a multiple conductor interconnect cable have already been reduced to the minimum practical value for manufacturing so as to maximize the number of conductors in the cable, then the only variable left to the designer in the trade off of electrical resistance and flexibility is to vary the conductor thicknesses along their length.

The method of producing electrical cable proposed in U.S. Pat. No. 5,274,195 (assigned to the assignee of the present application) discloses a chemical milling process for selectively reducing portions of electrically conductive outer laminae on both sides of a barrier layer which is resistant to the chemical milling process of the laminae prior to introduction of a supportive dielectric film. The manufacturing process which accomplishes this task involves the several steps of having to separately etch first one outer conductive lamina to produce a desired conductor thickness and define a desired conductor pattern, then etch the opposing outer conductive lamina to form the appropriate conductor pattern of multiple thicknesses and lastly to remove the barrier layer by a third etching process. The method of this prior art requires the support of the conductive pattern during the etching process by means other than the dielectric layer subsequently to be attached to the conductive pattern.

This method therefor requires the chemical milling process of the lamina to be undertaken individually and from both sides of the laminate thereby restricting the application of further lamina such as dielectric layers until the etching process on at least one side of the laminate is complete.

SUMMARY OF THE INVENTION

Wherefore, it is an object of the present invention to overcome the aforementioned problems and drawbacks associated with the prior art designs by providing a method of chemically etching a desired conductor pattern having at least two thicknesses by performing all the etching operations from a common side, thereby allowing a dielectric film to be applied prior to the etching process and reducing the number of steps involved in the overall manufacturing process and therefor the costs of such conductors.

Generally in accordance with the present invention a network of metallic conductors, including one or more relatively flexible (thin) areas integral with relatively rigid (thick) areas is formed from a relatively rigid composite metallic sheet for example TRi-Metal (TM) having a dielectric supporting layer fast with one side of the sheet prior to etching.

According to the invention, it provides a method of forming a conductive network, having relatively flexible electrical conductor areas integral with relatively rigid electrically conductor areas wherein the relatively rigid conductor areas are thicker than the relatively flexible conductor areas comprising the steps of: (a) providing a relatively rigid laminate, of cross-sectional thickness substantially equal to that required for said relatively rigid conductor areas, comprising a dielectric lamina fast with a first electrically conductive lamina which is in electrically conductive intimate contact with a second electrically conductive lamina by way of an electrically conductive barrier layer, the first and second conductive laminae being of a material etchable by an etchant which is not an etchant for the barrier layer; (b) selectively etching desired portions of the second electrically conductive lamina remote from the dielectric lamina to the barrier layer in at least the relatively flexible areas using said etchant; and (c) selectively etching desired exposed portions of the electrically conductive laminae to the dielectric lamina to form the conductive network using a different etchant from said etchant, the different etchant being chosen to etch both the conductive lamina and the barrier layer.

Preferably first and second conductive laminae comprise a metal selected from the group consisting of copper and alloys in which copper is a major constituent.

BRIEF DESCRIPTION OF THE DRAWINGS

The invention will now be described, by way of example, with reference to the accompanying drawings in which.

DESCRIPTION OF THE PREFERRED EMBODIMENTS

Figure 1:
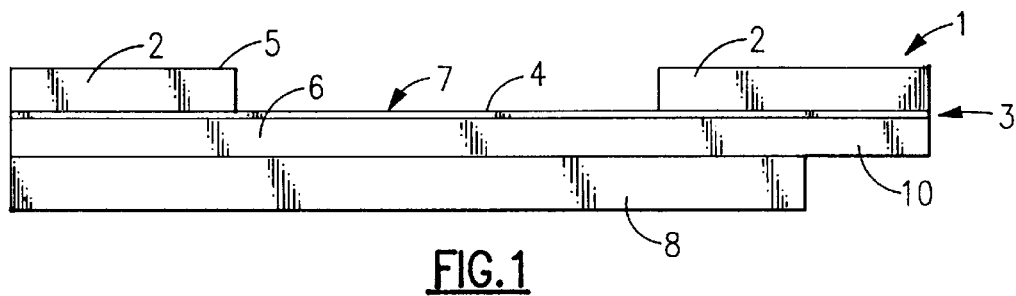
FIG. 1 is a side view of a Tri Metal (TM) conductive laminate and dielectric layer subsequent to a etching step reducing a layer of the conductive laminate thickness to the desired thickness defined by a barrier layer.
Figure 2:
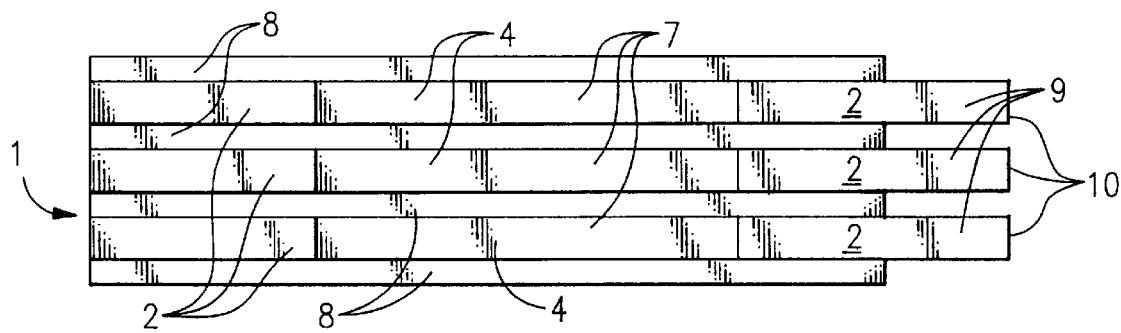
FIG. 2 is a top view of the individual conductive paths subsequent to the etching of the barrier layer and a second layer of the conductive laminate.

The method of producing a conductor pattern (1) having multiple thickness conductors relies on the provision of an electrically conductive laminate (3) such as Tri Metal (TM). The conductive laminate (3) is laminated to a dielectric (e.g. polyimide) sheet (8) (e.g. 1 mil. thick) Kapton (TM)), by a conventional adhesive system (such as acrylic of epoxy) or, alternatively, the conductive laminate (3) is part of an adhesiveless single sided laminate. In either case only one side (5) of the laminate is available for chemical etching. The conductive laminate (3), as illustrated in FIG. 1, is generally composed of a barrier layer (4) of nickel in intimate physical and electrical contact throughout with a first conductive lamina (2) of one ounce copper on one side, and an opposing second conductive lamina (6) of one ounce copper on the other side of the barrier layer (4).

The next step is selectively coating the metallic first conductive lamina (2) top surface with conventional acid resist materials to leave an exposed gross barred area(s) of the lamina (2) which are to be chemically milling (etched). These exposed metallic areas are etched down to the barrier layer to define the thin relatively flexible areas (7) of copper using etchant, e.g. ammoniated cupric chloride, which will not etch the nickel barrier (4). The coating is then removed by conventional means. The exposed nickel barrier may be removed at this time, if desired.

Figure 3:
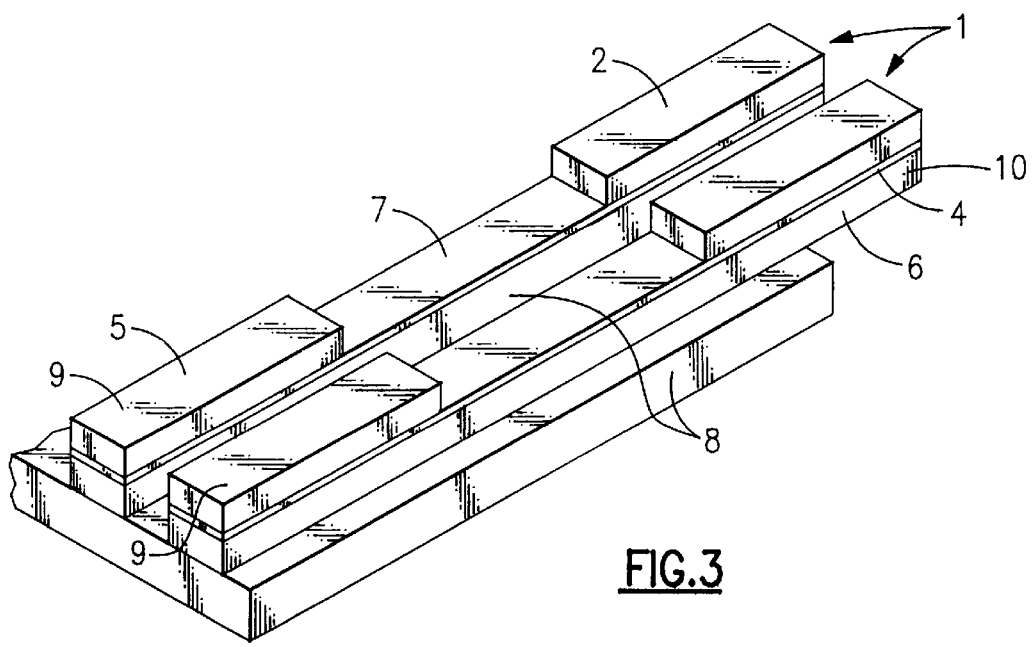
FIG. 3 is a perspective view of a two formed conductors of the conductor pattern and the dielectric layer also subsequent to the etching of the barrier layer and the second layer of the conductive laminate.

The next step involves the selective coating of the exposed metallic surfaces of the laminate (3) with conventional acid resist materials to define the desired high resolution conductive pattern (network) with the waste areas of the laminate (3) exposed. The waste exposed areas are then chemically milled using an etchant, such as ferric chloride, to etch both the copper layers (2) and (6) and the nickel barrier layer (4) down to the polyimide sheet (8) so as to define the individual conductor paths (9), two of which is shown in FIG. 3.

The selective coating is then removed by conventional means. Thus the process uses etching from the same face of the laminate (3) to product the desired electrically isolated conductor paths, having a plurality of thicknesses, from a laminate that includes a dielectric layer prior to etching.

If not previously removed and if desired a nickel stripper solution may be used to remove any exposed nickel barrier layer (4) from the remaining relatively flexible portions of the conductor.

Finally, any waste areas of the dielectric sheet (8) may be removed by conventional means.

It will be appreciated that the above described method lends itself to the manufacture of conductive networks in which portions of the copper lamina (6) are exposed (through windows in the dielectric sheet (8) and/or as projections (10) extending beyond the edges of the dielectric sheet (8)) prior to etching. In such cases, these exposed portions are coated with an acid resistant material as required during etching to prevent undesired etching of these exposed portions of copper.

In a variation of the preferred embodiment, the first etching step may be used to remove the lamina (2) not only in areas of relative flexibility but also in areas of waste material leaving only material of lamina (2) in the desired relatively thick areas of the conductive network being formed. Here the acid resist coating is not removed, but rather is supplemented, prior to the subsequent etching step of the method.

A significant advantage of the present method over the prior art is that the desired conductive network is supported by the dielectric sheet (8) throughout the formation of the multi-thickness conductive network.

It will be appreciated that although this specification refers to relatively flexible and relatively rigid areas, the structure envisioned may be what is generally regarded in this technology as a flexible circuit, the relative terms being used to denote different degrees of flexibility. In addition, the relatively rigid areas may appropriately be construed as being sufficiently rigid to form terminals. This disclosure should not be construed as being limited to all flexible, part rigid or all rigid circuits.

Wherefore, I claim:

1. A method of forming a conductive network, having relatively flexible electrical conductor areas integral with relatively rigid electrically conductor areas wherein the relatively rigid conductor areas are thicker than the relatively flexible conductor areas comprising the steps of:

(a) providing a relatively rigid laminate, of cross-sectional thickness substantially equal to that required for said relatively rigid conductor areas, comprising a dielectric lamina fast with a first electrically conductive lamina which is in electrically conductive intimate contact with a second electrically conductive lamina by way of an electrically conductive barrier layer, the first and second conductive laminae being of a material etchable by an etchant which is not an etchant for the barrier layer;

(b) selectively etching desired portions of the second electrically conductive lamina remote from the dielectric lamina to the barrier layer in at least the relatively flexible areas using said etchant; and (c) selectively etching desired exposed portions of the electrically conductive laminae to the dielectric lamina to form the conductive network using a different etchant from said etchant, the different etchant being chosen to etch both the conductive lamina and the barrier layer.

2. A method according to claim 1, wherein said the first and second conductive laminae comprise a metal selected from the group consisting of copper and alloys in which copper is a major constituent.

3. A method according to claim 2, wherein said barrier layer is nickel.

4. A method of forming a conductive network, having relatively flexible electrical conductor areas integral with relatively rigid electrically conductor areas, comprising the steps of:

(a) providing a relatively rigid laminate of cross-sectional thickness substantially equal to that required for said relatively rigid conductor areas, comprising a dielectric lamina fast with a first electrically conductive lamina which is in electrically conductive intimate contact with a second electrically conductive lamina by way of an electrically conductive barrier layer, the first and second conductive laminae being of a material etchable by an etchant which is not an etchant for the barrier layer;

(b) chemically milling the second conductive lamina from an exposed electrically conductive face thereof, so as to remove selected portions of said second lamina to a depth as constrained by said barrier layer thereby partially to define at least said relatively flexible conductive areas; and (c) chemically milling selected portions of the laminate, including said barrier layer, from exposed electrically conductive surfaces thereof to a depth as constrained by said dielectric layer thereby to define said conductive network.

5. The method according to claim 4, wherein said chemical milling of step (a) is performed using an etchant which is an etchant of said first and second conductive laminae, but is not an etchant of said barrier layer and wherein the chemical milling of step (b) is performed using an etchant which is an etchant of both said first and second conductive laminae and said barrier layer.

\* \* \* \* \*